United States Patent [19]
Dehn

[11] 4,211,911
[45] Jul. 8, 1980

[54] MICROWAVE DIRECTIONAL COUPLER AND DETECTOR MODULE

[75] Inventor: Rudolph A. Dehn, Schenectady, N.Y.

[73] Assignee: General Electric Company, Schenectady, N.Y.

[21] Appl. No.: 3,866

[22] Filed: Jan. 16, 1979

[51] Int. Cl.$^2$ .................. H05B 9/06; G01R 21/12; H01P 5/18
[52] U.S. Cl. ............................. 219/10.55 F; 324/95; 333/109; 333/116
[58] Field of Search ............... 219/10.55 A, 10.55 F; 324/95, 58 B; 333/109, 113, 115, 116

[56] References Cited
U.S. PATENT DOCUMENTS

| | | | |
|---|---|---|---|
| 2,901,709 | 8/1959 | Fitzmorris | 333/109 |
| 2,976,499 | 3/1961 | Sferrazza | 333/109 |
| 3,845,387 | 10/1974 | Humphrey | 333/109 X |
| 4,034,289 | 7/1977 | Rozylowicz et al. | 333/115 X |
| 4,122,449 | 10/1978 | Endo | 333/116 X |

OTHER PUBLICATIONS

Berkowitz, *Basic Microwaves,* Hayden Book Co., N.Y., 1966, p. 138.

*Primary Examiner*—Paul L. Gensler
*Attorney, Agent, or Firm*—Donald R. Campbell; James C. Davis; Marvin Snyder

[57] ABSTRACT

A module board comprised of a microstrip transmission line, terminating resistors and detectors is mounted over two coupling apertures spaced one quarter guide wavelength along a rectangular waveguide. The microstrip line has a length of five quarters of a wavelength as measured in the secondary line system. Output signals representing forward and reflected power flow in the waveguide are developed by the two detectors. This power sensor is low cost and compact and is suitable for a microwave oven.

9 Claims, 3 Drawing Figures

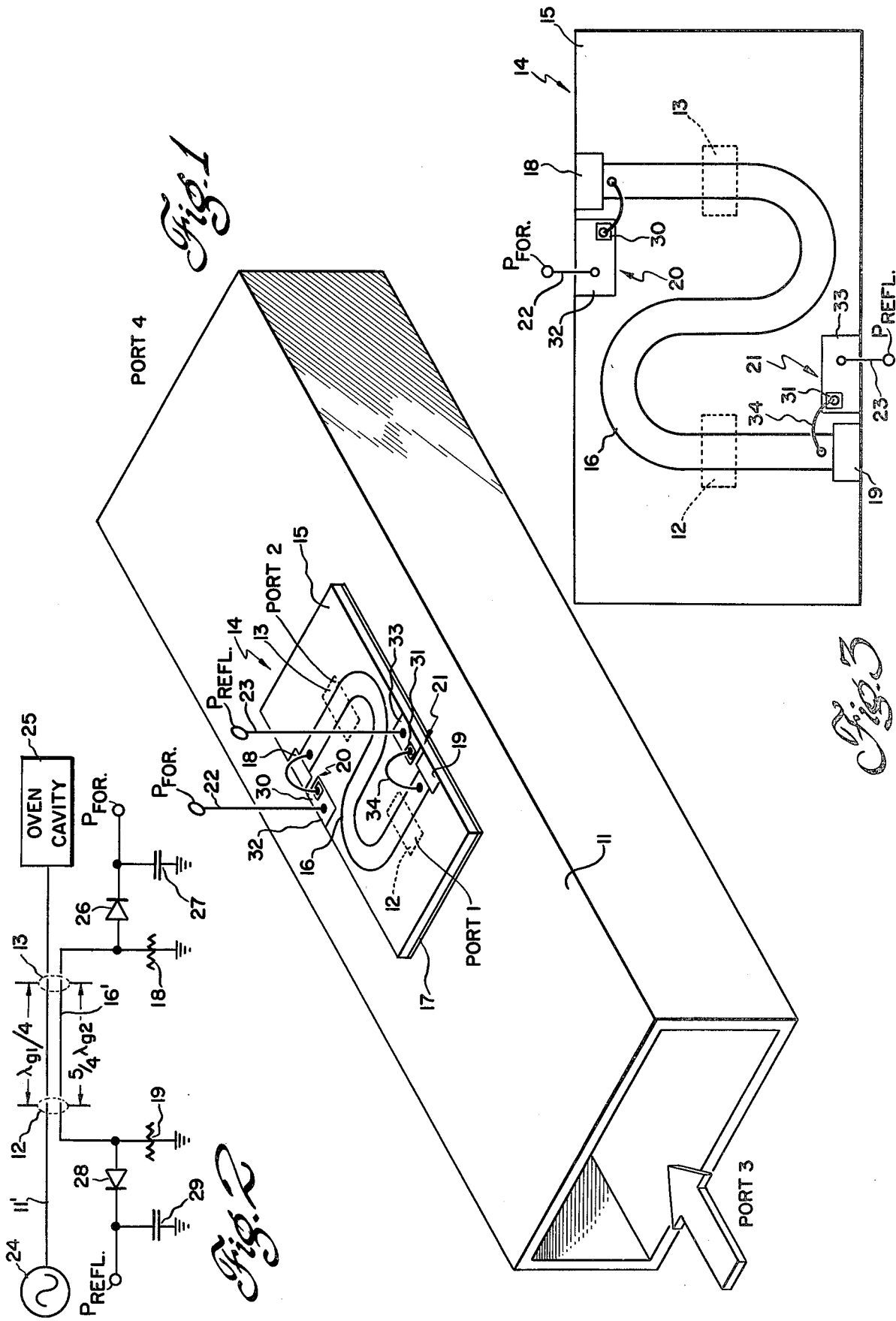

MICROWAVE DIRECTIONAL COUPLER AND DETECTOR MODULE

BACKGROUND OF THE INVENTION

This invention relates to measurement of the forward and reflected power flow of microwave energy, and especially to a low cost and compact directonal coupler and detector assembly located on waveguide connecting the source and an oven cavity or other load for determining the power flow components.

In order to control the net power flow to a variety of loads in a microwave oven, a power sensor is needed that is adaptable to existing microwave oven designs and which provides output signals related to both the forward and reflected components of wave energy in the waveguide between the magnetron oscillator and oven cavity. A prime requirement is potential low cost and the capability of indicating net power on a continuous basis. The amount of reflected wave energy varies for different food loads and also changes as the food temperature increases, and a good example of the latter is frozen foods because the dielectric properties of ice and water are much different. Having measured the power components, one way of using the information would be to adjust a tuning element to insure minimum reflection at all times and therefore maximum energy transmission with less stress on the magnetron. Other ways to realize improved cooking and oven performance will undoubtedly be suggested.

The directional coupler/detector unit to be described is based on the classical two-hole directional coupler, but the secondary or coupled transmission line system in these is the usual rectangular waveguide. A more compact approach is needed which can be manufactured economically.

SUMMARY OF THE INVENTION

Foward and reflected power flow in a waveguide are sensed by a directional coupler and detector which has a secondary TEM (transverse electromagnetic) transmission line such as microstrip, stripline or coaxial cable for the propagation of coupled wave energy from the waveguide. The guide has two coupling apertures that are spaced apart in the direction of wave propagation one quarter wavelength as measured in the guide system. Because the phase velocity in the coupled TEM line is less than that in waveguide, the electrical length of the TEM line is five quarters of a wavelength or an integral number of wavelengths longer than five quarters as measured in the secondary line system between its intersections with the coupling apertures. At either end of the TEM line are terminating resistors and detectors for developing output signals indicative of the components of power flow in the waveguide.

The preferred embodiment is a low cost microstrip module board secured in alignment with two appropriately sized apertures in conventional rectangular waveguide in a microwave oven. The serpentine microstrip line has a length of five quarters of a wavelength, and it and the terminating resistors and rf bypass capacitors are printed circuit components. A diode detector and series bypass capacitor are connected across the terminating resistor, and dc output voltages are developed at the outputs of the detectors representing forward and reflected power flow in the waveguide. Although not part of this invention, net power flow information can thus be derived and used in a closed loop control system.

BRIEF DESCRIPTION OF THE DRAWING

FIG. 1 is a perspective of a section of rectangular waveguide and a microstrip directional coupler/detector module board;

FIG. 2 is a schematic circuit diagram of the coupled transmission lines, diode detectors and rf bypass capacitors with dc outputs; and FIG. 3 is a plan view of the microstrip module depicted in FIG. 1.

DESCRIPTION OF THE PREFERRED EMBODIMENT

Referring to FIG. 1, a directional coupler and detector in the form of a microstrip module board is mounted over two coupling apertures in rectangular waveguide. The microstrip format is convenient for integration of terminating resistors and diode detectors, and consequently a low cost module with dc output signals proportional to both forward and reflected power flow is realized. The top wall of conventional $TE_{10}$ waveguide 11 has a pair of coupling apertures 12 and 13 (also referred to as ports 1 and 2) of appropriate size that are spaced one quarter guide wavelength apart in the direction of wave propagation and may be located at different positions with respect to the width of the waveguide. When located along the centerline, maximum electric field coupling will be realized and this preferred arrangement is illustrated. The direction of forward power flow is designated by the large arrow and is from port 3 toward port 4, and reflected power flow is from port 4 to port 3.

The module board is indicated generally at 14 and is made up of a dielectric substrate 15 on one surface of which is formed a secondary microstrip transmission line 16. The general class of transmission line in the secondary system is a TEM (transverse electromagnetic) line, and besides microstrip other types to be mentioned later are stripline and coaxial cable. The reverse side of the substrate board has a conductive ground plane 17, although this is not essential, which is continuous with the exception of holes corresponding to coupling apertures 12 and 13. Module board 14 is soldered, screwed, or otherwise fastened to the top wall in alignment with ports 1 and 2 such that a very small portion of the microwave energy propagating in the waveguide is coupled through the apertures into microstrip line 16. The electrical length of the secondary line between points where it crosses or intersects the coupling ports is desirably made equal to one quarter wavelength as measured in the secondary line system. However, the phase velocity of waves in the TEM line will always be equal to or less than the velocity of light in air, whereas the phase velocity in the main waveguide will always exceed the velocity of light. It is therefore physically impossible to have a secondary line one quarter wavelength long, and the next length which will satisfy the directionality requirement of the power sensor is five quarters of a wavelength. Lines longer than five quarters by an integral number of wavelengths may also be used, i.e., nine-quarters, thirteen-quarters, and so on, but the bandwidth over which good directivity is achieved is restricted. A five quarter wavelength line as measured in the secondary line system is therefore preferred.

Serpentine microstrip line 16 is extended beyond its intersections with coupling apertures 12 and 13 and extends into a pair of terminating resistors 18 and 19 where the coupled wave energy is dissipated. Diode detector assemblies 20 and 21 at either end measure the voltage drop across the terminating resistors and generate output signals related to forward power flow and reflected power flow that are available on output leads 22 and 23.

The two-hole coupler operates as follows. A portion of the forward wave flowing from port 3 toward port 4 is coupled via port 1 into the secondary system where it propagates in both directions. A succeeding portion is also coupled from the main guide at port 2 and again propagates in both directions. That portion coupled at port 1 undergoes a 5/4λ phase change in arriving at port 2 while the portion coupled at port 2 undergoes a λ/4 change. Hence these two waves reinforce and propagate onward in the secondary line as a sample of the forward wave energy. A similar summation of waves at port 1 shows that the coupled wave which propagated from port 1 to port 2 in the waveguide and from port 2 to port 1 in the secondary line is 6/4λ out of phase with the wave coupled directly at 1 and the two cancel. From the symmetry of the system, it is seen that reflected energy propagating from port 4 toward port 3 will set up coupled waves in secondary line 16 such that they reinforce at port 1 and cancel at port 2.

FIG. 2 shows that the primary transmission line 11', i.e. waveguide 11, in a microwave oven is between a magnetron oscillator or other source of microwave energy 24 and oven cavity 25, and has coupling apertures 12 and 13 that are spaced apart one-quarter wavelength as measured in the guide system, $\lambda_{g1}/4$. Coupled TEM transmission line 16', i.e. microstrip line 16, on the other hand has an electrical length between the coupling ports of five-quarters of a wavelength as measured in the secondary line system, $5/4\lambda_{g2}$. The signal in the secondary line is typically 50 db weaker than the main signal and is at an appropriate level for diode detectors. As frequency departs from the design center where the desired reinforcement and cancellation takes place, there will be increasingly less perfect directivity and this is accentuated by the need to use a long phase length in the secondary line. However, the most popular frequency band assigned to microwave ovens in 2400–2500 MHz and operation actually takes place in the 2440–2460 portion of this band. For a design center frequency of 2450 MHz, the phase error at 2440 and 2460 MHz is ±1.8°. This will lead to approximately 3% error voltage but this is only 0.1% error in the power measurement.

At one end of secondary line 16', a diode detector 26 and series rf bypass capacitor 27 are connected across terminating resistor 18 and are operative to rectify the voltage across the resistor and generate a dc output signal which is indicative of forward power flow, $P_{FOR}$. Diode detectors may be operated such that their detected output voltage is essentially proportional to incident rf power (square law operation) or such that output voltage is more nearly proportional to incident rf voltage (linear operation). For this application, square law response is preferred. At the other end of secondary line 16', a diode detector 28 and series rf bypass capacitor 29 are placed across terminating resistor 19 and develop a dc output signal related to the reflected power flow, $P_{REFL}$. The latter output signal is zero for the situation of 100 percent forward power flow and changes as the amount of reflected power increases or decreases. If there is 100 percent reflected power, both $P_{FOR}$ and $P_{REFL}$ signals will be equal.

The microstrip format is convenient in that the secondary transmission line, the two terminating resistances and the two rf bypass capacitors can be printed circuit components. In FIG. 3, microstrip line 16 and metallization pads 32 and 33 are made, for example, of copper, either by a subtractive process (etching) or additive process as is well known in the art. Terminating resistors 18 and 19 are deposited on the top surface of dielectric substrate 15, and can be screened on graphite ink. Diode detector chips 30 and 31 are mounted on contact pads 32 and 33 and have wire or ribbon leads 34 connecting them to either end of microstrip line 16. Metallizations 32 and 33 also serve as the top plates of two bypass capacitors; substrate 15 is the capacitor dielectric and ground metallization 17 provides the bottom capacitor plate. Moreover, output leads 22 and 23 are bonded to top metallizations 32 and 33. This microstrip module is both economical to manufacture and relatively flat so that it fits into available space.

An alternative configuration is that the secondary transmission line on the directional coupler/detector module board has a stripline geometry. There is a ground plane on both sides of the printed circuit secondary transmission line, and one way of building the stripline module board is to place a second board with an outer ground metallization on top of the module board in FIG. 1, with cutouts to accommodate the flying leads, diode chips, and output leads. Another embodiment uses a coaxial transmission line in the secondary system. The coaxial cable is looped, and the terminating resistors and diode detectors may be packaged in different forms than has been discussed.

One application of the directional coupler and detector module is to determine continuously the net power flow in a microwave oven, which is simply the difference between forward and reflected power flow. This information is fed into a closed loop control system that is not further defined. This is not a precision directional coupler, but a 1 percent error or less in a microwave oven is negligible. A different type of application is a weather radar for a small private airplane. Directional couplers have utility in measuring reflected power, or in measuring the reflection from a load as a means of determining the impedance of the load.

While the invention has been particularly shown and described with reference to several preferred embodiments thereof, it will be understood by those skilled in the art that the foregoing and other changes in form and details may be made therein without departing from the spirit and scope of the invention.

What is claimed is:

1. A directional coupler and detector in combination with wavewguide through which microwave energy propagates from a source to a load and vice versa and which has a pair of coupling apertures in one wall that are spaced apart in the direction of wave propagation one quarter wavelength as measured in the waveguide system;

said directional coupler and detector comprising a secondary transverse electromagnetic (TEM) transmission line intersecting said apertures which has a length of five quarters of a wavelength or an integral number of wavelengths longer as measured in the secondary line system between the intersections with said apertures, a portion of the microwave energy being coupled through said apertures into the secondary line;

a terminating resistance at either end of said secondary transmission line, and a diode detector and series bypass capacitor connected across each resistance for developing output signals respectively indicative of forward and reflected power flow in the waveguide.

2. The combination of claim 1 wherein said secondary transmission line is a microstrip line on a dielectric substrate board which is secured to the waveguide.

3. The combination of claim 1 wherein said secondary transmission line, terminating resistances and bypass capacitors are printed circuit components on a dielectric substrate board which is secured to the waveguide, the diode detectors also being mounted on said board.

4. A directional coupler and detector module in combination with rectangular waveguide through which microwave energy propagates from a source to a load and vice versa and which has a pair of coupling apertures in one wall that are spaced apart in the direction of wave propagation one quarter wavelength as measured in the waveguide system;

said directional coupler and detector module comprising a secondary serpentine microstrip transmission line on a substrate board which crosses said apertures and which has a length of five quarters of a wavelength as measured in the secondary line system between the intersections with said apertures, a portion of the microwave energy being coupled through said apertures into the microstrip line; and means on said board at both ends of said microstrip line for developing separate dc output signals indicative of forward and reflected power flow in the waveguide.

5. The combination of claim 4 wherein the last-mentioned means comprises terminating resistors deposited on the board at either end of said microstrip line, opposing metallizations on the board to serve as two rf bypass capacitors, and diode detectors connected between each end of said microstrip line and an associated metallization which further has an output lead for one of said dc signals.

6. In a microwave oven having a source of microwave energy and rectangular waveguide through which wave energy propagates to and from an oven cavity and which has a pair of coupling apertures in one wall that are spaced apart in the direction of wave propagation one quarter wavelength as measured in the waveguide system, the combination with said rectangular waveguide of a directional coupler and detector module;

said directional coupler and detector comprising a secondary transverse electromagnetic (TEM) transmission line intersecting said apertures which has a length of five quarters of a wavelength as measured in the secondary line system between the intersections with said apertures, a portion of the wave energy being coupled through said apertures into the secondary line; and means at each end of said secondary line for developing output signals indicative of the forward and reflected power flow in the waveguide.

7. The combination of claim 6 wherein said secondary transmission line is a serpentine microstrip line on a substrate board which is secured to the waveguide.

8. The combination of claim 7 wherein the last-mentioned means comprises terminating resistors deposited on said board at each end of said microstrip line, opposing metallizations on said board to serve as two rf bypass capacitors, and two diode detectors each connected between an end of said microstrip line and an associated metallization which further has an output lead for a corresponding output signal.

9. The combination of claim 6 wherein the last-mentioned means comprises a terminating resistor at each end of said secondary transmission line, and a diode detector and series rf bypass capacitor connected across each resistor for developing dc output signals indicative of forward and reflected power flow in the waveguide, said secondary line and terminating resistors and bypass capacitors being printed circuit components on a substrate board which is secured to the waveguide, the diode detectors also being mounted on said board.

* * * * *